United States Patent
Shell et al.

[19]

[11] Patent Number: 6,121,058

[45] Date of Patent: Sep. 19, 2000

[54] METHOD FOR REMOVING ACCUMULATED SOLDER FROM PROBE CARD PROBING FEATURES

[75] Inventors: Melissa K. Shell, Sunnyvale; Richard S. Yoshimoto, San Jose, both of Calif.

[73] Assignee: Intel Corporation, Santa Clara, Calif.

[21] Appl. No.: 09/002,479

[22] Filed: Jan. 2, 1998

[51] Int. Cl.[7] ................................................. H01L 21/00
[52] U.S. Cl. ....................... 438/4; 438/14; 134/2; 134/3; 134/6; 134/41
[58] Field of Search ............................ 438/4, 14; 134/2, 134/3, 6, 41

[56] References Cited

U.S. PATENT DOCUMENTS

| | | |
|---|---|---|
| 3,615,950 | 10/1971 | Lacal ........................................ 216/108 |
| 4,314,855 | 2/1982 | Chang et al. ................................ 134/3 |
| 5,288,332 | 2/1994 | Pustilnik et al. ............................. 134/3 |
| 5,521,518 | 5/1996 | Higgins ..................................... 324/754 |
| 5,657,394 | 8/1997 | Schwartz et al. ......................... 382/151 |
| 5,778,485 | 7/1998 | Sano et al. .................................. 15/301 |
| 5,802,714 | 9/1998 | Kobayashi et al. ......................... 216/17 |
| 5,814,158 | 9/1998 | Holländer et al. ........................... 134/3 |

*Primary Examiner*—Kevin M. Picardat
*Attorney, Agent, or Firm*—Blakely, Sokoloff, Taylor & Zafman LLP

[57] ABSTRACT

A method for removing deposits from a probing feature of a probe card. The method includes the step of exposing the probing feature of a probe card to a composition that chemically reacts with the deposits on the probing feature to remove the deposits from the probing feature while not substantially effecting the material comprising the probing feature.

23 Claims, 7 Drawing Sheets

METHOD FOR REMOVING ACCUMULATED SOLDER FROM PROBE CARD PROBING FEATURES

BACKGROUND OF THE INVENTION

1. Field of the Invention

The present invention relates to the field of semiconductor testing equipment and, more specifically, to the field of probe cards for semiconductor test systems.

2. Description of the Related Art

In the manufacture of semiconductor devices, it is advisable that such components be tested at the wafer level to evaluate their functionality. The process in which die on the wafer are tested is commonly referred to as "wafer sort". Testing and determining design flaws at the die level offers several advantages. First, it allows designers to evaluate the functionality of new devices during development. Increasing packaging costs also make wafer sorting a viable cost saver, in that the reliability of each die on the wafer may be tested before incurring the high costs of packaging.

Wafer sorting typically involves the use of probing technology wherein a probe card containing probing features engages the die so as to connect the bond pads of the die to a tester. With recent advances in silicon technology, microprocessor performance is becoming limited by chip to package interconnections. Three primary processes—wirebonding (WB), tape automated bonding (TAB), and controlled collapse chips connection (C4)—are used to interconnect a chip to a package. The C4 technology utilizes solder bumps, comprised of mostly lead and some tin, to interconnect the chip to a package. During wafer sorting the probing features of the probe card contact the solder bumps.

Figure 1:
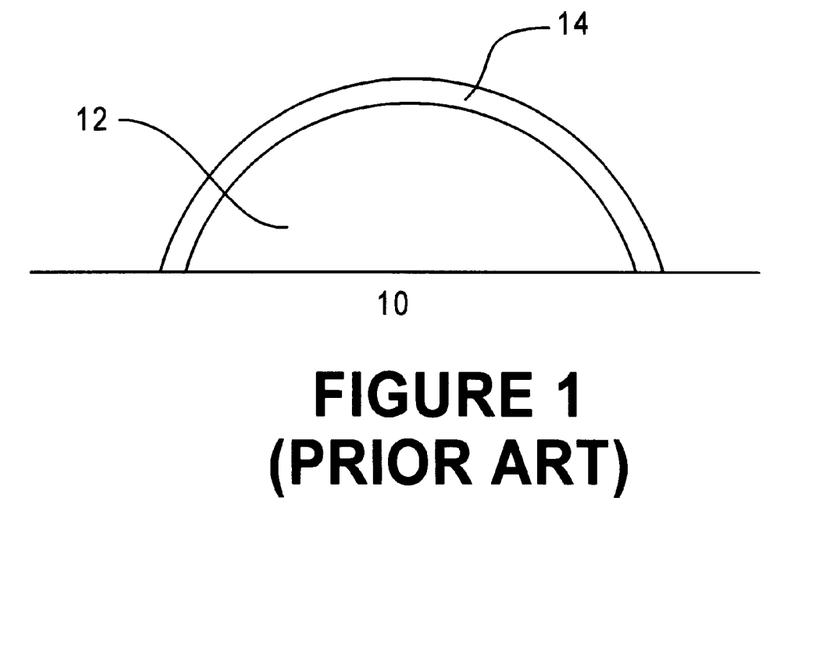
FIG. 1 illustrates a cross-sectional view of a typical solder bump.

Most categories of probing utilize some form of scrub to ensure electrical contact between the probing feature and a bond pad or solder bump. FIG. 1 shows a solder bump 10 with an oxide layer 12, typically a non-conductive film formed on the surface of exposed lead and tin. Generally, scrub applies to any non-conductive layer that produces a barrier between the probing features of a probe card and the base metal of a bond pad. The purpose of the scrub is to break through the non-conductive layer in order to establish good electrical contact between the probing features and the base metal of the bond pads or solder bumps. Scrub occurs when the handler forces the wafer, and, subsequently, the bond pads of a die, against the probe features on the probe card causing the probe feature to deflect. The scrub is generated by a small horizontal movement of each probe feature across the surface of each corresponding bond pad as the probing features deflect. As the probing features move across the bond pads or solder bumps, they penetrate the non-conductive oxide layer thereby establishing good electrical contact between the probing features and the bond pads or solder bumps.

Figure 2A:
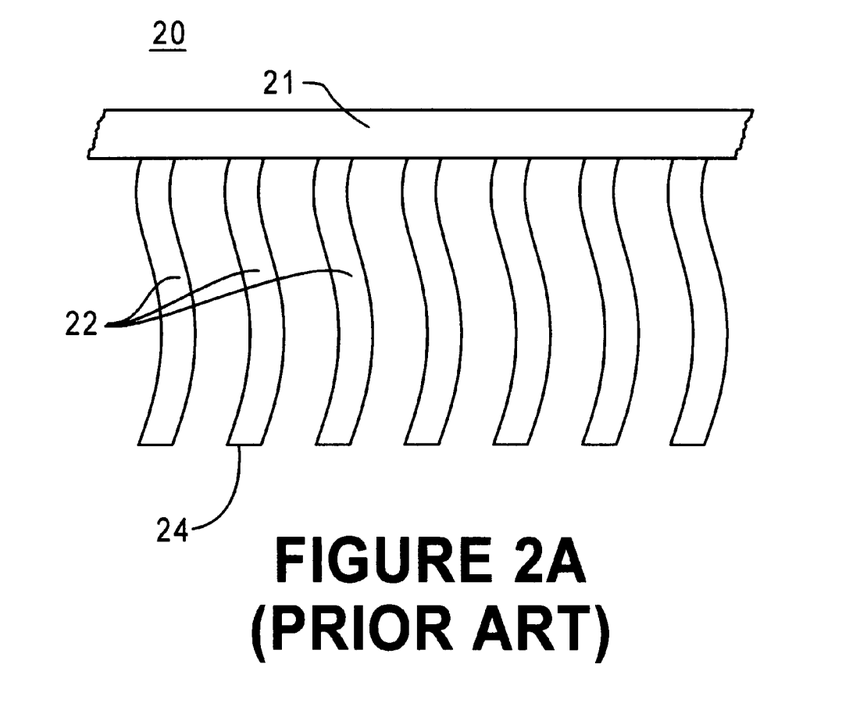
FIG. 2A presents a side view of a portion of a probe card with microspring probing features.
Figure 2B:
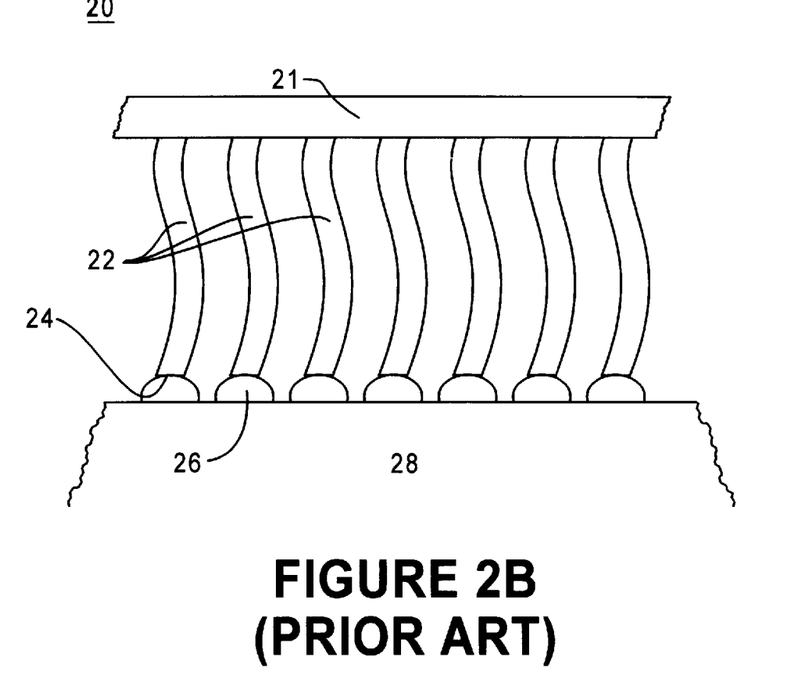
FIG. 2B presents the probing features illustrated in FIG. 2A touching down on solder bumps.
Figure 2C:
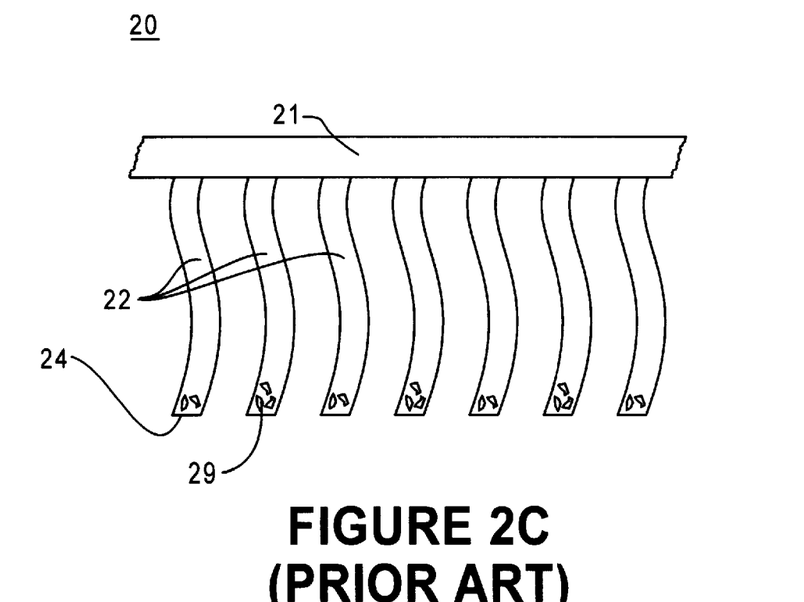
FIG. 2C presents the probing features illustrated in FIG. 2B with solder deposits thereon.

In the process of making contact with a bonding pad or a solder bump, a deposit accumulates on the probing feature of the probe card. For example, when a solder bump is comprised of primarily lead and some tin, a deposit consisting primarily of lead, lead oxides, and lead alloys adheres to the probing feature. FIGS. 2A–2C roughly demonstrate the wafer sort process. FIG. 2A illustrates a portion of probe card 20 with microspring probing features 22 coupled to multi-layer ceramic space transformer 21 and probing feature tips 24. During wafer sort, as roughly shown in FIG. 2B, microspring tips 24 touch down on solder bumps 26 which are part of integrated circuit device 28. The lead tin alloy is extremely malleable and easily adheres to the metal or metal alloy probing feature. FIG. 2C depicts microsprings 22 following a wafer sort during which solder deposits 29 have accumulated on microsprings 22 bridging the small gap between microsprings. The probing features of probe cards are spaced very close together. For example, in one configuration, a microspring probe card may have 1,500 microsprings (40 mils tall; 5.5–6 mils diameter) with a minimum pitch (spacing) between the microsprings of 225 micron.

Figure 3:
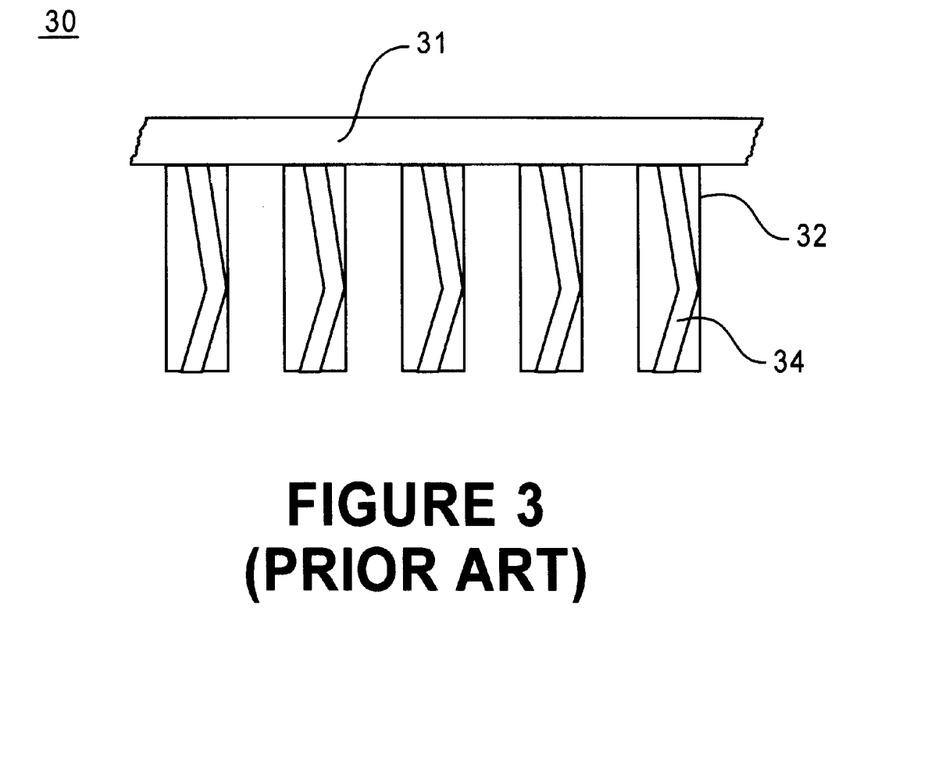
FIG. 3 presents a side view of a portion of a probe card with buckling beam probing features.
Figure 4:
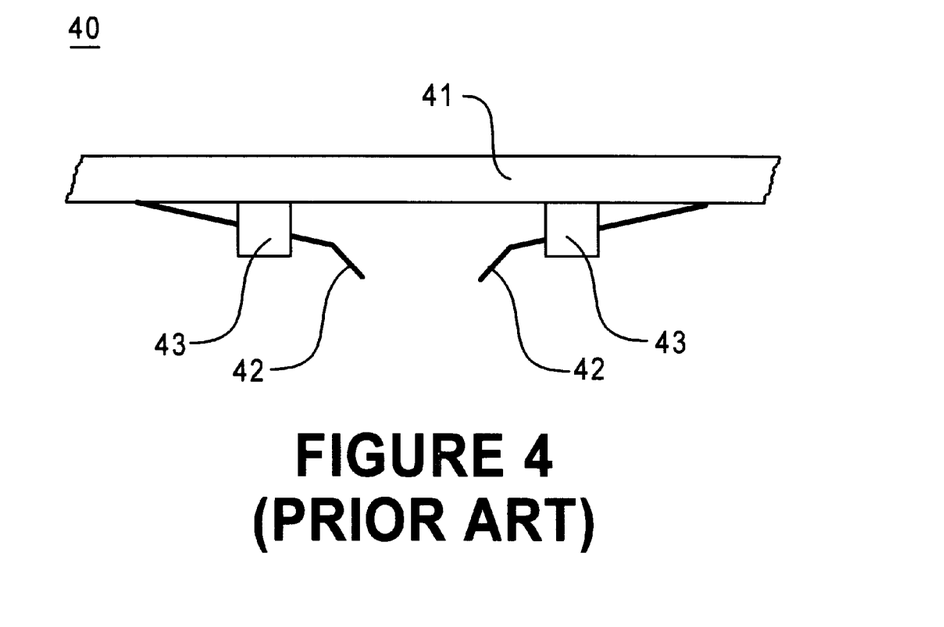
FIG. 4 presents a side view of a portion of a cantilever-needle probe card.
Figure 5:
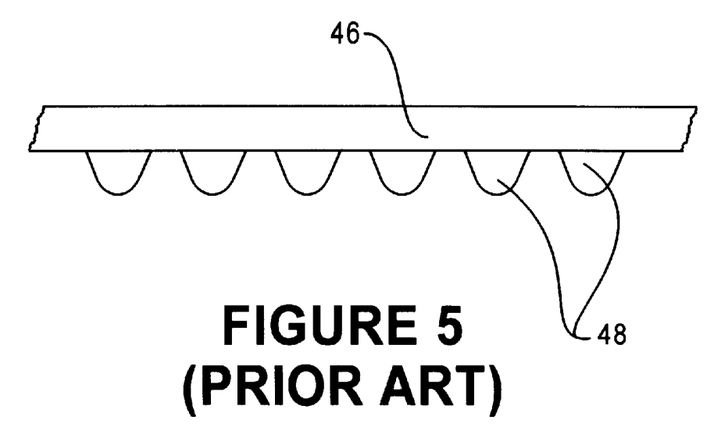
FIG. 5 presents a side view of a portion of a membrane probe card.

FIGS. 3, 4 and 5 depict additional types of probing features although it is appreciated that other types of probing features are available. FIG. 3 illustrates a portion of a probe card 30 with probing features 34 contained within a tubular housing. The probing feature or "beam" deflects upon contact with a solder bump by buckling or bending. The probing features are coupled to a multi-layer ceramic space transformer 31. A third example of a probing feature is shown in FIG. 4, which illustrates a "cantilever needle" probe card 40. The cantilever needles 42 are connected to a printed circuit board 41 and held in place by an epoxy ring 43. Finally, FIG. 5 depicts a cross sectional view of a "membrane" probe card 45 with probing features 48 connected to a flexible printed circuit 46. As discussed above, the lead tin composition on the surface of the solder bump easily adheres to the metal or metal alloy probing feature without regard to the shape or type of probing feature utilized during the wafer sort process.

Stray particle and solder buildup contributes to high contact resistance between the probing feature's tip and the solder bump. High contact resistance causes inaccurate voltage levels during device testing due to the non-conductive layer produced across the probe tip. This may cause a device to incorrectly fail, resulting in unnecessarily lower test yields. Moreover, the accumulated buildup of solder deposits may bridge the small gap between probing features resulting in shorts or leakage currents, again, leading to unnecessarily lower test yields. Additionally, with respect to the buckling beam probing feature, illustrated in FIG. 3, the solder buildup may cause the probing feature to be lodged within the lower die plate. In order to ensure accurate wafer sort test results, deposits that adhere to a probing feature during wafer sort must be removed.

Figure 6:
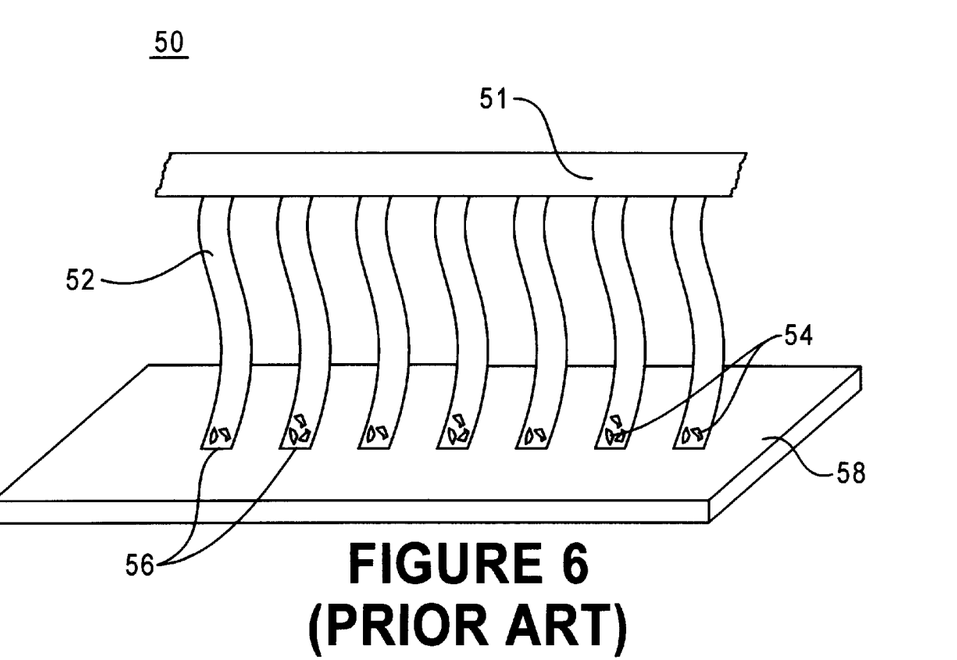
FIG. 6 presents a prior art method of cleaning the probing features of a probe card.

An existing method for removing these deposits from the probing features is the abrasive cleaning method illustrated in FIG. 6 which depicts a portion of probe card 50 with probing features 54 extending from multi-layer ceramic space transformer 51. After deposits 54 build up on microsprings 52 during wafer sort, tips 56 of microsprings 52 are brought into contact with an abrasive paper 58. By moving probe card 50 in relation to abrasive paper 58, deposits 54 are removed from tips 56, however deposits 54 remain along the length of microspring 52, due to the adhesive nature of the solder. Typically probing features are abrasively cleaned once every 100 die.

The abrasive cleaning method is undesirable because the method (i) results in excessive erosion of the probing feature which dramatically reduces the lifetime of the probe card; (ii) only removes deposits from the tips of the probing features allowing the deposits to accumulate on the non-tip portion of the probing feature; and (iii) is less effective for removing solder from dirty probing features which have remained on a prober for an extended period of time where the solder has oxidized. Because the abrasive paper is flat and relatively non-compliant, the abrasive cleaning method is not suitable for removing deposits from the non-tip portion of the probing feature.

Another method used to remove deposits from a probing feature involves placing the probing feature in an acid-based composition. Tungsten cantilever needle probing features are typically placed in an acidic solution which dissolves the probing feature thereby removing the aluminum or lead-tin oxide buildup on the probing feature. The problem with this method is that the lifetime of the probe card is dramatically reduced since the tip of the probing feature is partially dissolved as it is exposed to the acid-based cleaning composition.

Thus, what is needed is a non-destructive method of removing unwanted deposits from probing features of a probe card which solves the problems associated with current removal techniques.

SUMMARY OF THE INVENTION

A method for removing deposits from a probing feature of a probe card is disclosed. The method includes the step of exposing the probing feature of a probe card to a composition that chemically reacts with deposits on the probing feature of a probe card to remove the deposits from the probing feature without substantially reacting with the probing feature itself. In one embodiment, the probe features of a probe card are cleaned by exposing the probe features to a composition comprising acetic acid, hydrogen peroxide, and deionized water.

BRIEF DESCRIPTION OF THE DRAWINGS

The present invention is illustrated by way of example and is not limited by the figures of the accompanying drawings, in which like references indicate similar elements, and in which.

DETAILED DESCRIPTION OF THE INVENTION

A method for removing deposits from a probing feature of a probe card is disclosed. The method includes the step of exposing the probing feature to a composition that chemically reacts with deposits on the probing feature to remove the deposits from the probing feature without substantially reacting with the material comprising the probing feature. The improved method for removing deposits from these features is non-destructive and removes the deposits which build up between probe card features.

Referring to the figures, exemplary embodiments of the invention will now be described. The exemplary embodiments are provided to illustrate aspects of the invention and should not be construed as limiting the scope of the invention.

Figure 7:
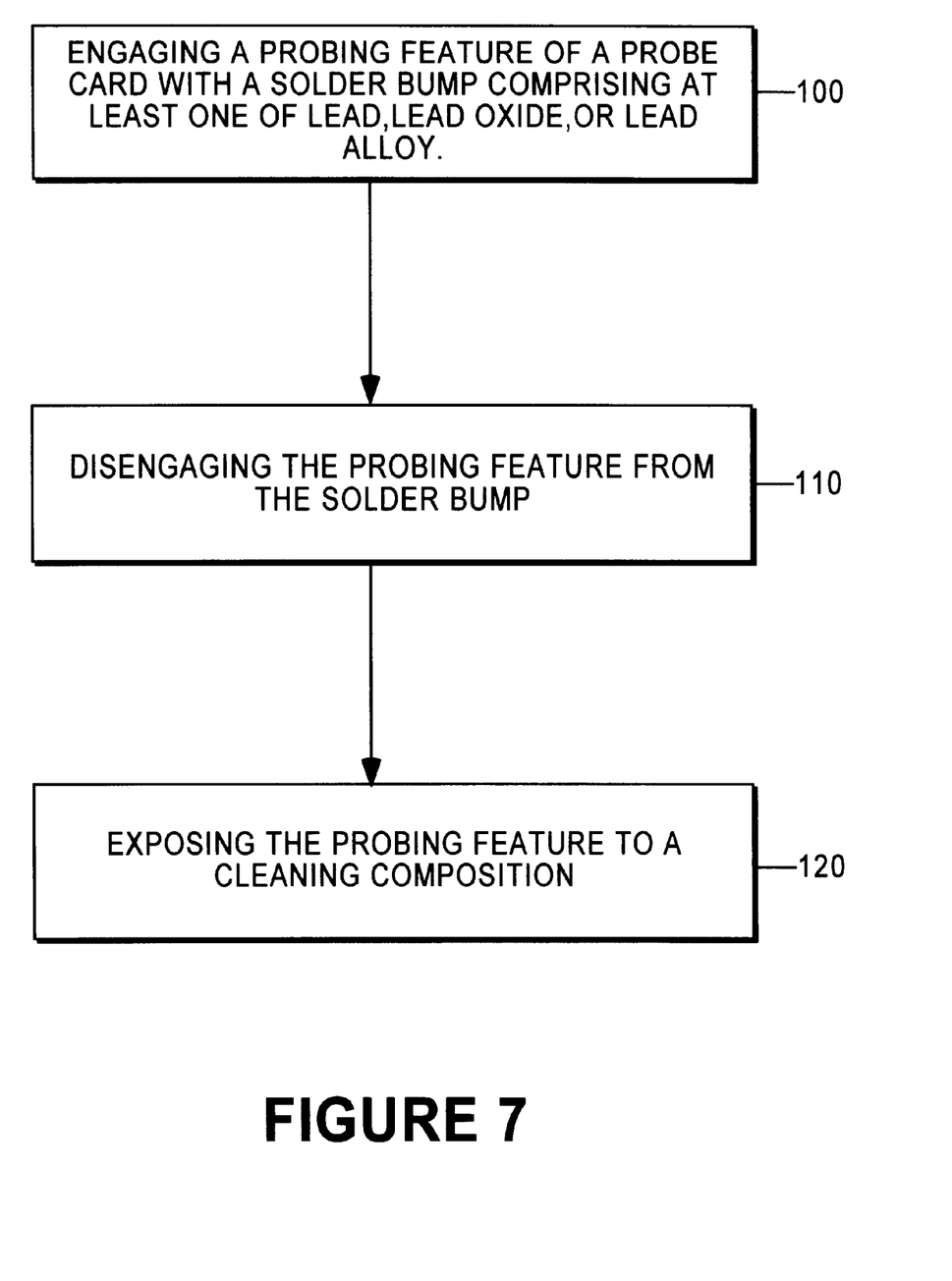
FIG. 7 presents a flowchart of one embodiment of the present invention.

FIG. 7 illustrates a process flowchart for probing an integrated circuit device in one embodiment of the present invention. As previously discussed and as illustrated in FIGS. 2A–2C, probing features 22 of probe card 20 contact solder bumps 26 on integrated circuit device 28 during a wafer sort, as indicated in block 100. As a result of contacting solder bumps 26, solder deposits 29 adhere to probing features 22 of probe card 20. After testing, probing features 22 disengage the integrated circuit device 28, as indicated in block 110. Probing features 22 are next exposed to a composition or solution (block 120) which chemically reacts with solder deposits 29 which substantially or completely removes solder deposits 29 from probing features 22 without substantially reacting with the material comprising probing features 22.

The probing feature 22 is typically made of a metal or metal alloy, for example, a nickel alloy, and the solder bump is typically made of primarily lead with some tin. During a wafer sort, solder deposits comprised of lead (Pb), lead oxides (PbO), or lead alloys accumulate on the probing feature of the probe card. Stray particle and solder buildup contributes to high contact resistance between the probing feature and the solder bump which in turn causes inaccurate voltage levels during device testing. Moreover, the accumulated buildup of solder may bridge the small gap between probing features resulting in shorts or leakage currents, again leading to unnecessarily lower test yields. In order to remove these deposits, the present invention includes a process in which the probe features are cleaned by exposing the features to a composition comprised of acetic acid ($CH_3COOH$) and hydrogen peroxide ($H_2O_2$). The cleaning solution may also include deionized water ($H_2O$). The deionized water provides a clean source of water that may be used to dilute the composition. This facilitates the ultimate disposal of the solution. In one embodiment, a composition consisting of acetic acid ($CH_3COOH$), hydrogen peroxide ($H_2O_2$) and deionized water ($H_2O$), in an approximately 1:1:1 volume ratio, is used to remove the solder deposits without significantly affecting the probe features.

Figure 8A:
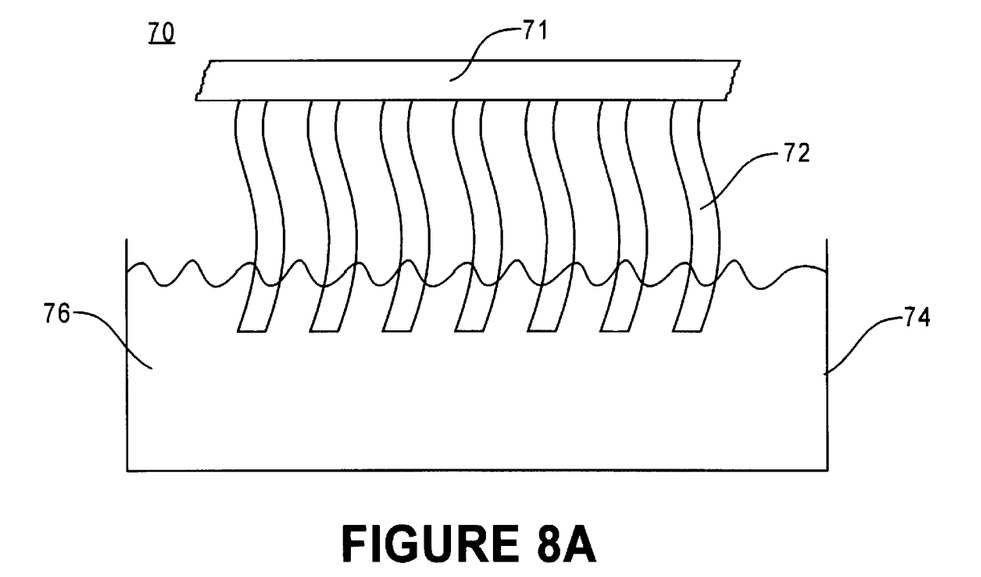
FIG. 8A show the probing features of a probe card being cleaned in accordance with one embodiment of the present invention.
Figure 8B:
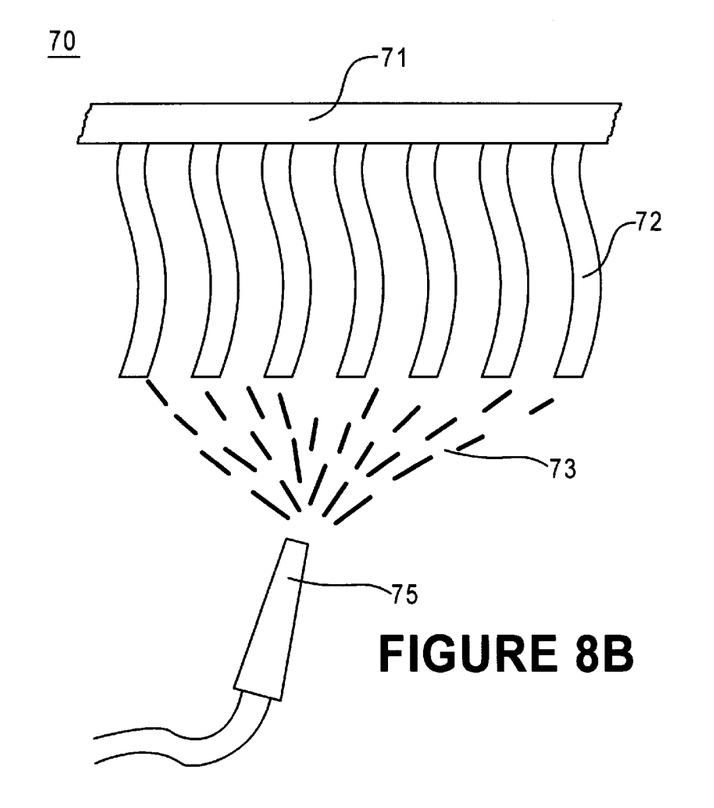
FIG. 8B shows the probing features of a probe card being cleaned in another embodiment of the present invention.

It is appreciated that the manner of exposing the probing features to the composition may be accomplished in any number of ways. For example, and without limitation, (i) (as shown in FIG. 8A) the probing features 72 of a probe card 70 extending from multi-layer ceramic space transformer 71 may be submerged in a container 74 of a cleaning composition 76 comprising acetic acid, hydrogen peroxide and DI water; or (ii) (as shown in FIG. 8B) probing features 72 of probe card 70 may be sprayed with composition 73 comprising acetic acid, hydrogen peroxide, and DI water through a nozzle 75.

Figure 9:
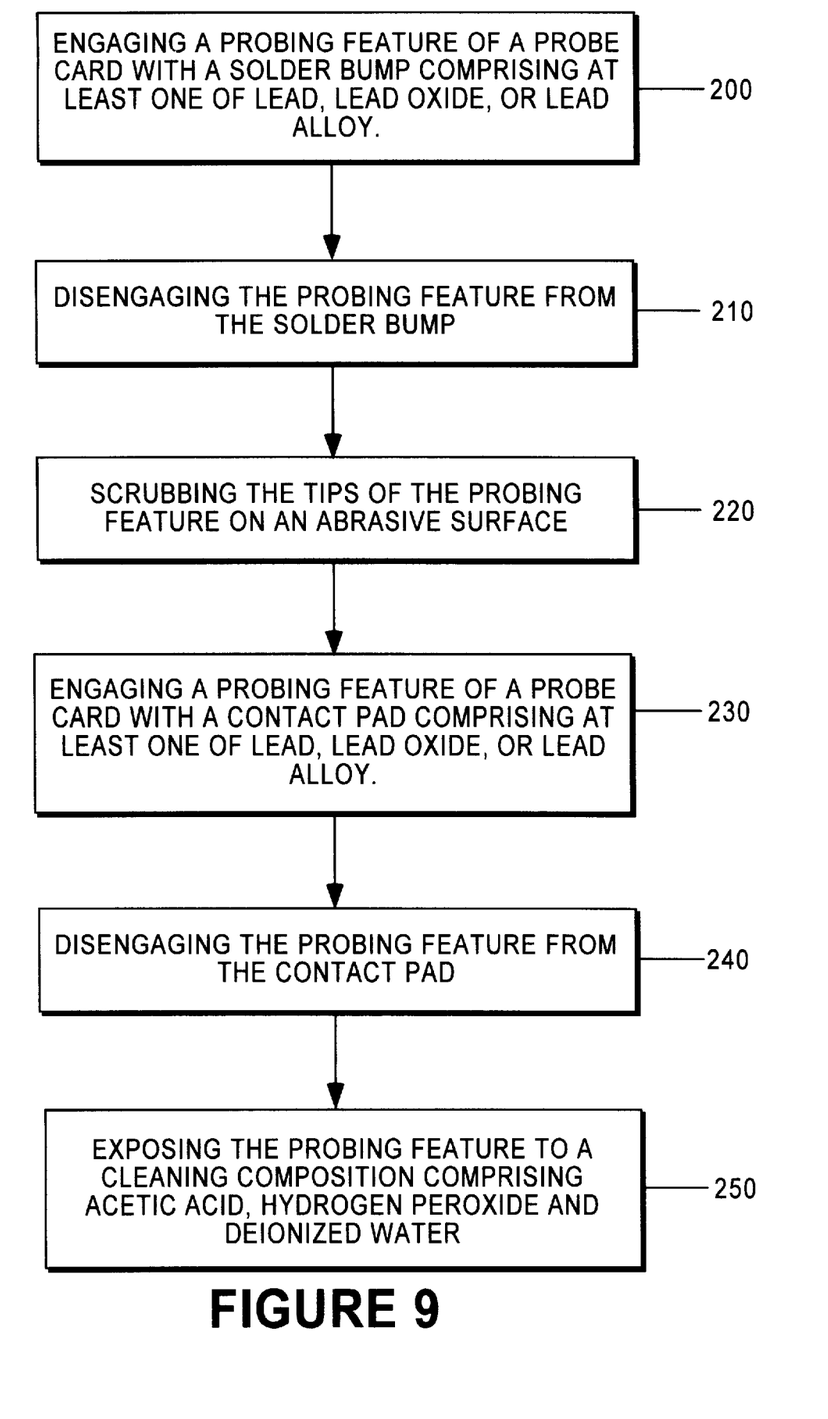
FIG. 9 presents a flow chart of another embodiment of the present invention.

The cleaning method of the present invention may also be used in conjunction with the abrasive cleaning method. FIG. 9 illustrates a process flowchart for probing an integrated circuit in another embodiment of the present invention. As previously discussed and as illustrated in FIGS. 2A–2C, probing features 22 of probe card 20 contact solder bumps 26 on an integrated circuit device 28 during a wafer sort, as indicated in block 200. As a result of contacting solder bumps 26, solder deposits 29 adhere to probing features 22 of probe card 20. After testing, probing features 22 disengage the integrated circuit device 28, as indicated in block 210. Typically, after testing between approximately 100 to 500 dies, the probing features are scrubbed on an abrasive surface which removes the lead-tin material from the tips of the probing feature, as indicated in block 220. Following the abrasive scrub (block 220), the probing feature reengages (block 230) at least one die for testing and disengages (block 240) the die following testing. In one embodiment, the number of dies tested prior to chemical cleaning typically ranges between approximately 10,000 to 25,000. This range and the number of die tested prior to a chemical cleaning may vary if (i) certain patterns of electrical failures are detected on a number of die in a row, or (ii) dirty probing features are not scrubbed within an hour or two of testing. Following at least one cycle utilizing the abrasive scrub, the probing features are exposed to a composition or solution which chemically reacts with the solder deposits (block 250) which substantially or completely removes the solder deposits from the probing feature without substantially reacting with the material comprising the probing feature. In one embodiment, the cleaning composition comprises hydrogen peroxide, deionized water and acetic acid.

Upon contact, the composition chemically reacts with the deposits, removing the deposits from the probing feature of the probe card which is substantially accomplished by the reactions: (i) lead and hydrogen peroxide react to form lead oxide and water; and (ii) lead oxide, deionized water, and acetic acid react to form lead acetate and water. The material comprising the probing feature, typically a nickel alloy, does not substantially react with the cleaning composition. Moreover, by exposing the probing feature to the cleaning composition, solder deposits are removed from both (i) the tips, and (ii) the length of the probing features. Furthermore, exposing the probing feature to the cleaning solution (i) inhibits solder from bridging the gaps between probing features; and (ii) facilitates the cleaning of buckling beam type probing features. After exposing the probing feature to the chemical solution, the probing feature may be dried in a variety of ways including merely exposing them to the atmosphere or blowing air, clean air, or nitrogen over the probing feature.

In one embodiment: After testing approximately 10,000 die and following multiple abrasive scrub cycles, the probing features, comprised of a nickel alloy, are sprayed, through a nozzle, with a cleaning composition comprised of hydrogen peroxide, acetic acid, and deionized water in a 1:1:1 volume ratio which substantially or completely removes the solder deposits from the probing features without substantially reacting with the nickel alloy. The probing features are sprayed with the cleaning composition for two 45 second periods, each cleaning period utilizing a fresh cleaning composition. The probing features are then rinsed with deionized water. Clean air is then blown over the probing features to accelerate the drying process. Following drying, the probe card resumes testing die in a wafer sort.

It is appreciated that other chemical compositions may remove undesirable deposits without adversely reacting with the probe features. Moreover, practitioners in the art will appreciate that the scope of the present invention is not limited to probe cards but may be used in conjunction with any structure containing test probes. It is further understood that the present invention may be used in any application wherein the removal of an electrical insulator layer or other non-conductive particles is required to establish a good electrical connection between the probing features of a tester and a solder bump or other means of coupling the base metal of a bond pad to the tester.

Thus, a nondestructive method for removing bond pad or solder bump deposits from probing features of a probe card is described. Although many alterations and modifications of the present invention will no doubt become apparent to the person of ordinary skill in the art having read the foregoing description, it is to be understood that the particular embodiments shown and described by way of illustration are in no way intended to be limiting.

What is claimed is:

1. A method to remove a deposit from a probing feature of a probe card, the method comprising the step of:

exposing a substantial portion of the probing feature to a composition that chemically reacts with said deposit to remove said deposit from said probing feature, said composition being non-reactive with said probing feature.

2. The method of claim 1 wherein the deposit is at least one of lead, lead oxides, and lead alloys.

3. The method of claim 1 wherein said composition is comprised of acetic acid and hydrogen peroxide.

4. The method of claim 1 wherein said composition is comprised of acetic acid, hydrogen peroxide and deionized water.

5. The method of claim 1 wherein said composition is comprised of acetic acid, hydrogen peroxide, and deionized water in a 1:1:1 volume ratio.

6. The method of claim 1 wherein said probing feature comprises a metal or metal alloy.

7. The method of claim 1 wherein said probing feature is made of a nickel alloy.

8. The method of claim 1 wherein said step of exposing said probing feature to said composition comprises submerging at least a portion of said probing feature in said composition.

9. A method to remove a deposit from a probing feature of a probe card, the method comprising the step of:

exposing said probing feature to a composition that chemically reacts with said deposit to remove said deposit from said probing feature, said composition being non-reactive with said probing feature, wherein said step of exposing said probing feature to said composition comprises spraying at least a portion of said probing feature with said composition.

10. A method for testing an integrated circuit device with a probe card, the method comprising the steps of:

a) engaging a probing feature of said probe card with a contact pad of said integrated circuit device;

b) disengaging said probing feature from said contact pad of said integrated circuit device; and c) exposing a substantial portion of the probing feature to a composition that chemically reacts with a deposit on the probing feature to substantially remove said deposit from said probing feature, said composition being substantially non-reactive with a material comprising said probing feature.

11. The method of claim 10 wherein said composition comprises acetic acid and hydrogen peroxide.

12. The method of claim 10 wherein said composition comprises acetic acid, hydrogen peroxide and deionized water.

13. The method of claim 10 wherein said composition comprises hydrogen peroxide, acetic acid and deionized water in a 1:1:1 volume ratio.

14. The method of claim 11 wherein said step of exposing said probing feature to said composition comprises submerging at least a portion of said probing feature in said composition.

15. A method for testing an integrated circuit device with a probe card, the method comprising the steps of:
 a) engaging a probing feature of said probe card with a contact pad of said integrated circuit device;
 b) disengaging said probing feature from said contact pad of said integrated circuit device; and
 c) exposing said probing feature to a composition that chemically reacts with a deposit on the probing feature to substantially remove said deposit from said probing feature, said composition being substantially non-reactive with a material comprising said probing feature, wherein said step of exposing said probing feature to said composition comprises spraying at least a portion of said probing feature with said composition.

16. A method for testing an integrated circuit device with a probe card, the method comprising the steps of:
 a) engaging a probing feature of said probe card with a contact pad of said integrated circuit device;
 b) disengaging said probing feature from said contact pad of said integrated circuit device;
 c) scrubbing the probing feature on an abrasive surface to remove a deposit formed on the probing feature; and
 d) exposing said probing feature to a composition that chemically reacts with a remaining deposit on the probing feature to substantially remove said remaining deposit from said probing feature said composition being substantially non-reactive with a material comprising said probing feature.

17. The method of claim 16 wherein said composition is comprised of acetic acid and hydrogen peroxide.

18. The method of claim 16 wherein said composition is comprised of hydrogen peroxide, acetic acid and deionized water in a 1:1:1 volume ratio.

19. The method of claim 16 wherein said step of exposing said probing feature to said composition comprises submerging at least a portion of said probing feature in said composition.

20. A method for testing an integrated circuit device with a probe card, the method comprising the steps of:
 a) engaging a probing feature of said probe card with a contact pad of said integrated circuit device;
 b) disengaging said probing feature from said contact pad of said integrated circuit device;
 c) scrubbing the probing feature on an abrasive surface to remove a portion of a deposit formed on the probing feature; and
 d) exposing said probing feature to a composition that chemically reacts with a remaining deposit on the probing feature to substantially remove said remaining deposit from said probing feature said composition being substantially non-reactive with a material comprising said probing feature, wherein said step of exposing said probing feature to said composition comprises spraying at least a portion of said probing feature with said composition.

21. A method for testing an integrated circuit device with a probe card comprising the steps of:
 a) repeatedly engaging and disengaging microspring probing features of a probe card with contact pads of multiple integrated circuit devices, said contact pads comprising at least one of lead, lead oxide, or lead alloy said probing features comprised of nickel alloy;
 b) intermittently scrubbing the probing features on an abrasive surface wherein a portion of at least one of lead, lead oxide or lead alloy deposits formed on the probing features is substantially removed; and
 c) intermittently spraying the probing features with a composition comprised of acetic acid, hydrogen peroxide and deionized water in a 1:1:1 volume ratio that chemically reacts with at least one of the lead, lead oxide or lead alloy deposits on the probing features to substantially remove said deposits from said probing features.

22. A composition for cleaning a probing feature of a probe card comprised of acetic acid and hydrogen peroxide, wherein said composition removes at least one of lead, lead oxides and lead alloys from said probing feature of a probe card wherein said composition is comprised of hydrogen peroxide and acetic acid in approximately a 1:1 volume ratio.

23. A method for removing a lead, lead alloy, or lead oxide deposit from a probing feature of a probe card, said method comprising the step of:
 exposing said probing features to a cleaning solution comprising acetic acid and hydrogen peroxide, wherein said step of exposing said probing features to said composition comprises spraying at least a portion of said probing features with said composition.

* * * * *